(12) United States Patent
Kim et al.

(10) Patent No.: US 8,526,111 B2
(45) Date of Patent: Sep. 3, 2013

(54) OPTICAL SHEET WITH STRUCTURED SURFACE

(75) Inventors: Kyoung Hwa Kim, Yongin-si (KR); Kyoung Jong Kim, Suwon-si (KR); Dae Shik Kim, Yongin-si (KR)

(73) Assignee: Kolon Industries, Inc., Gwacheon-si (KR)

( * ) Notice: Subject to any disclaimer, the term of this patent is extended or adjusted under 35 U.S.C. 154(b) by 508 days.

(21) Appl. No.: 12/812,431

(22) PCT Filed: Jan. 9, 2009

(86) PCT No.: PCT/KR2009/000119
§ 371 (c)(1),
(2), (4) Date: Sep. 15, 2010

(87) PCT Pub. No.: WO2009/088247
PCT Pub. Date: Jul. 16, 2009

(65) Prior Publication Data
US 2011/0051247 A1   Mar. 3, 2011

(30) Foreign Application Priority Data

Jan. 10, 2008  (KR) .................. 10-2008-0002944
Feb. 1, 2008   (KR) .................. 10-2008-0010507
Feb. 1, 2008   (KR) .................. 10-2008-0010508
Jan. 9, 2009   (KR) .................. 10-2009-0001690

(51) Int. Cl.
*G02B 5/02*   (2006.01)

(52) U.S. Cl.
USPC .................................. 359/599; 73/7

(58) Field of Classification Search
None
See application file for complete search history.

(56) References Cited

U.S. PATENT DOCUMENTS

| | | | |
|---|---|---|---|
| 6,602,596 B2 * | 8/2003 | Kimura et al. ............. 428/327 |
| 6,624,937 B2 * | 9/2003 | Kashima ................ 359/485.02 |
| 6,967,225 B2 | 11/2005 | Mcenhill et al. | |
| 7,990,618 B2 * | 8/2011 | Miyaki et al. .............. 359/599 |
| 2004/0061944 A1 * | 4/2004 | Kashima et al. ........... 359/599 |
| 2005/0227165 A1 * | 10/2005 | Yamada et al. .......... 430/270.1 |
| 2006/0087743 A1 | 4/2006 | Choi et al. | |
| 2007/0086209 A1 | 4/2007 | Hwang et al. | |

FOREIGN PATENT DOCUMENTS

| | | |
|---|---|---|
| JP | 2005-010230 A | 1/2005 |
| JP | 2008-530346 A | 8/2008 |
| JP | 2009-522717 A | 6/2009 |
| KR | 10-2005-0045601 A | 5/2005 |
| KR | 10-2007-0042786 A | 4/2007 |
| KR | 10-0784551 A | 12/2007 |
| WO | 2006/088930 A2 | 8/2006 |
| WO | 2007/007852 A1 | 1/2007 |
| WO | 2007/094558 A1 | 8/2007 |

* cited by examiner

*Primary Examiner* — Arnel C Lavarias
(74) *Attorney, Agent, or Firm* — Sughrue Mion, PLLC

(57) ABSTRACT

An optical sheet having a structured surface and a composition for forming optical three-dimensional patterns able to form the structured surface, which is not easily damaged by external force or a rough surface and thus facilitates the handling thereof, reduces defective rates to thus decrease the production cost and increase the production efficiency, and prevents a decrease in luminance attributable to damage.

18 Claims, 3 Drawing Sheets

OPTICAL SHEET WITH STRUCTURED SURFACE

TECHNICAL FIELD

The present invention relates to an optical sheet, and more particularly, to an optical sheet having a structured surface with optical three-dimensional (3D) patterns, such as a prism sheet.

BACKGROUND ART

A liquid crystal display (LCD) useful as an optical display device is an indirect light-emitting device which shows an image by controlling the transmittance of an external light source, and the light source device thereof, a backlight unit, is an important part helping to determine the properties of the LCD.

In particular, as a technique for fabricating an LCD panel becomes more devolved, the demand for LCDs which are slim and have high luminance is increased. Accordingly, various attempts to increase the luminance of the backlight unit have been made. The LCD suitable for use in monitors, PDAs (Personal Digital Assistants), and notebook computers is evaluated to be superior when it emits bright light rays from a low energy source. Thus, in the case of the LCD, front-surface luminance is regarded as very important.

Because the LCD is configured such that light passing through a light diffusion layer is diffused in all directions, the quantity of light traveling toward the front surface is much too low. Hence, great effort is continually made into exhibiting higher luminance with lower power consumption. Further, as the area of the display is enlarged, the viewing angle is required to be wider to enable the image to be viewed by more observers.

To this end, the power of the backlight unit may be increased. However, power consumption and concomitant power loss attributable to heat are increased in proportion to the increase thereof. In the case of portable displays, the capacity of the battery must be increased, and the life span thereof is shortened.

Hence, with the goal of increasing the luminance, methods of imparting light with directional properties have been proposed. For this, various lens sheets have been developed. A representative example thereof is an optical sheet having a prism array on the surface thereof.

Typically, an optical sheet having a prism array is configured such that it has a triangular array having a surface tilted at 45° to improve front-surface luminance.

However, because the structured surface of the optical sheet has mountain-shaped prism structures, peaks of the prism structures may be easily broken or distorted by small scratches on the exterior, undesirably causing the problem of damaging the prism structures. Further, all the angles emitted from the same-shaped prism structures of the array are the same. In the case where the peaks of the structures in the prism array are slightly destroyed or small scratches are created in the tilted surface thereof, the emitted light path between the damaged portion and the normal portion becomes different, undesirably reducing luminance and increasing the rate of defection. So, in the production of a prism sheet, problems in which the front surface of the prism sheet cannot be used depending on the position of small defects may arise, undesirably leading to a decrease in productivity and thus to a high cost burden. Actually, manufacturers who assemble backlight modules considerably suffer because of the high defective rates attributable to damage to prism structures by scratches caused when the prism sheets are handled.

Moreover, in the backlight unit consisting of a plurality of sheets and films which are layered, a plurality of prism films may be provided to increase luminance. In this case, when the upper surface of the lower prism film comes into contact with the lower surface of the upper prism film, the prism structures may be disadvantageously damaged.

Thus, in order to prevent damage to the prism structures, use of a protective film has been proposed. However, as the LCD panel is required to be slimmer, the general trend is to omit such a film or to use a multifunctional sheet, and also, if a process of forming a protective film is added, the production cost is increased and temporal and physical efficiencies are decreased.

In addition to damage to the prism structures attributable to handling, while portable displays, such as notebook computers and PDAs, are increasingly used, they are frequently transported in a state of being placed in a bag. During the transport thereof, when impact is applied to the display when a user runs or a car stops suddenly, the prism structures in the display are damaged even in the presence of the protective film, negatively affecting the image screen.

Therefore, there is an urgent need for an optical sheet having a structured surface capable of flexibly accommodating external impact.

Typically, the backlight unit causes light to be emitted using a light source such as a cold cathode fluorescent lamp (CCFL), so that such emitted light is sequentially passed through a light guide plate, a light diffusion element such as a light diffusion sheet or a light diffusion plate, and a prism sheet, before reaching a liquid crystal panel. The light guide plate functions to transfer light emitted from the light source in such a manner as to distribute it over the front surface of the liquid crystal panel, which is planar, and the light diffusion element plays a role in realizing uniform light intensity over the front surface of a screen. The prism sheet functions to control the light path so that light traveling in various directions through the light diffusion element is transformed within a range of viewing angles θ suitable for enabling the image to be viewed by an observer. Further, a reflection sheet is provided under the light guide plate to reflect that light which does not reach the liquid crystal panel and is outside of the light path, so that such light is used again, thereby increasing the efficient use of the light source.

So, in order to effectively transfer the emitted light to the liquid crystal panel, a plurality of sheets having various functions is provided. As a result of the use of the plurality of sheets, however, light interference occurs, and also the films may become damaged owing to physical contact between the sheets, undesirably causing problems such as low productivity and high cost.

Recent attempts to reduce the number of optical sheets in order to simplify the production process have been made. Examples of such are where a prism film is adhered onto a light diffusion element or prism patterns are formed on a light diffusion element. Such a plate is advantageous in terms of cost or productivity, but is problematic in that an increase in luminance falls very short of expectations.

Therefore, methods of sufficiently increasing luminance while at the same time minimizing the use of optical sheets to increase it are required.

DISCLOSURE

Technical Problem

Accordingly, the present invention provides an optical sheet having a structured surface, which resists damage caused by external predetermined force or a rough surface upon application to a display.

Also, the present invention provides an optical sheet having a structured surface, in which damage to the structured surface of the optical sheet is easily prevented, thus facilitating the handling thereof.

Also, the present invention provides an optical sheet, which prevents a reduction in luminance attributable to change in light path.

Also, the present invention provides an optical sheet, which reduces defective rates and the production cost and increases production efficiency.

Also, the present invention provides an optical sheet having a structured surface, which resists damage caused by external predetermined force or a rough surface upon application thereof to a display and also which has luminance equivalent to or higher than that of conventional cases in which a light diffusion element and a prism sheet are provided, thus reducing the number of mounted sheets.

In addition, the present invention provides multifunctional optical sheet having a structured surface, in which damage to the structured surface of the optical sheet is easily prevented, thus facilitating the handling thereof.

Also, the present invention provides a multifunctional optical sheet, which prevents a reduction in luminance attributable to change in light path.

Also, the present invention provides a multifunctional optical sheet, which reduces defective rates and the production cost, and increases production efficiency.

Also, the present invention provides a multifunctional optical sheet, which exhibits appropriate hiding performance.

In addition, the present invention provides an optical sheet assembly, which obviates a need for a protective film, and reduces the number of mounted optical sheets.

Technical Solution

According to an embodiment of the present invention, there is provided an optical sheet having a structured surface formed with a plurality of optical 3D patterns and including a curable resin, wherein the optical sheet has a damage resistance load of 20 g or more, the damage resistance load being measured in a way such that a polyethyleneterephthalate film including a coating layer containing particles with a surface roughness Sz of 0.5~15 µm and a hardness ranging from 2 B to 2 H is disposed on the structured surface of the optical sheet so that the coating layer thereof is in contact with the structured surface of the optical sheet, the optical sheet is pulled at a rate of 300 mm/min while applying a varying load to the polyethyleneterephthalate film, and a maximum value of the varying load is defined as the damage resistance load when the structured surface of the optical sheet has no substantial damage.

According to the embodiment of the present invention, which may include a substrate layer; a light diffusion layer formed on at least one surface of the substrate layer and including a binder resin and light-diffusing particles; an air layer formed on the light diffusion layer and including a binder resin and foam beads; and a light-collecting layer formed on the air layer and having the structured surface formed with the plurality of optical 3D patterns and including the curable resin with or without foam beads.

According to the embodiment of the present invention, the optical sheet may include a substrate layer; a light diffusion layer formed on at least one surface of the substrate layer and including a binder resin and light-diffusing particles; and a light-collecting layer formed on the light diffusion layer and having the structured surface formed with the plurality of optical 3D patterns and including the curable resin with foam beads.

According to the embodiment of the present invention, the optical sheet may include a substrate layer; a light diffusion layer formed on at least one surface of the substrate layer and including a binder resin and light-diffusing particles; and a light-collecting layer formed on the light diffusion layer and having the structured surface formed with the plurality of optical 3D patterns and including the curable resin.

According to the embodiment of the present invention, the optical sheet may include a substrate layer; a particle dispersion layer formed on one surface of the substrate layer and including a binder resin and light-diffusing particles; and a light-collecting layer formed on the other surface of the substrate layer and having the structured surface formed with the plurality of optical 3D patterns and including the curable resin.

According to the embodiment of the present invention, the optical sheet may include a substrate layer; a light diffusion layer formed on at least one surface of the substrate layer and including a binder resin, light-diffusing particles and foam beads; and a light-collecting layer formed on the light diffusion layer and having the structured surface formed with the plurality of optical 3D patterns and including the curable resin.

According to the embodiment of the present invention, the optical sheet may include a substrate layer; and a light-collecting layer formed on at least one surface of the substrate layer and having the structured surface formed with the plurality of optical 3D patterns and including the curable resin with foam beads and light-diffusing particles.

In the optical sheet according to the embodiment of the present invention, the damage resistance load may be 30 g or more, and preferably 30~500 g.

As such, the curable resin may be formed from a curable composition including one or more UV curable oligomers or UV curable monomers selected from among at least one compound selected from among a urethane acrylate-based compound, a styrene-based compound, a butadiene-based compound, an isoprene monomer and a silicone acrylate-based compound, and mixtures thereof with at least one compound selected from among a bisphenol acrylate-based compound and a fluorene acrylate-based compound; and a photoinitiator.

According to a preferred embodiment of the present invention, the curable resin may be formed from a curable composition comprising a urethane acrylate-based compound and a bisphenol acrylate-based compound as the UV curable oligomers or UV curable monomers. As such, the curable resin may be formed from the curable composition in which the urethane acrylate-based compound is contained in an amount of 10~80 parts by weight based on 100 parts by weight of a total solid content. Also, the curable resin may be formed from the curable composition in which the bisphenol acrylate-based compound is contained in an amount of 5~80 parts by weight based on 100 parts by weight of a total solid content.

According to the preferred embodiment of the present invention, the curable resin may be formed from the curable composition having a viscosity of 100~5,000 cps at 25° C.

In the optical sheet according to the embodiment of the present invention, the curable resin may have a glass transition temperature of 40° C. or lower, and preferably may be in the range of −15~25° C.

In the optical sheet according to the embodiment of the present invention, the optical 3D patterns may have one or more shapes selected from among polyhedrons having a polygonal, semicircular or semi-elliptical cross-section, columns having a polygonal, semicircular or semi-elliptical cross-section, and curved columns having a polygonal, semicircular or semi-elliptical cross-section.

In addition, the optical 3D patterns of the optical sheet may be provided in a shape of columns having a triangular cross-section with a vertex angle of 90°.

Advantageous Effects

When the optical sheet according to an embodiment of the present invention is applied to a display, damage to the structured surface thereof can be prevented even when under an external predetermined load, thus facilitating the handling thereof.

Also, the structured surface of the optical sheet is not damaged even in the absence of an additional protective film, thus simplifying a process of manufacturing a backlight unit, reducing the production cost and increasing the production efficiency.

The optical sheet according to the embodiment of the present invention can prevent luminance from decreasing as a result of damage, and thus can maintain intrinsic functions of an optical sheet imparted upon its manufacture.

In the manufacturing process, the optical sheet is not easily damaged attributable to film layering or external impact, thus reducing defective rates, resulting in decreased production cost and increased production efficiency.

When the multifunctional optical sheet according to another embodiment of the present invention is applied to a display, damage to the structured surface thereof can be prevented even when under an external predetermined load, thus facilitating the handling thereof. Further, this sheet can increase luminance while uniformly diffusing light emitted from a light source, and also can exhibit superior hiding performance.

Compared to conventional cases in which a light diffusion element and a prism sheet are provided, the multifunctional optical sheet can simplify the manufacturing process and can reduce the manufacturing cost, and also enables the fabrication of a slimmer LCD.

Moreover, the optical sheet or multifunctional optical sheet according to the present invention can prevent light interference, loss of light due to scattering or absorption, and damage to the sheet occurring as a result of layering a plurality of sheets.

Also, the optical sheet can be applied to portable displays, such as notebook computers or PDAs, which are not easily damaged even when under external impact, such as is caused when a user runs or a car stops suddenly in a state in which the portable displays are placed in a bag.

DESCRIPTION OF THE REFERENCE NUMERALS IN THE DRAWINGS

Figure 1:
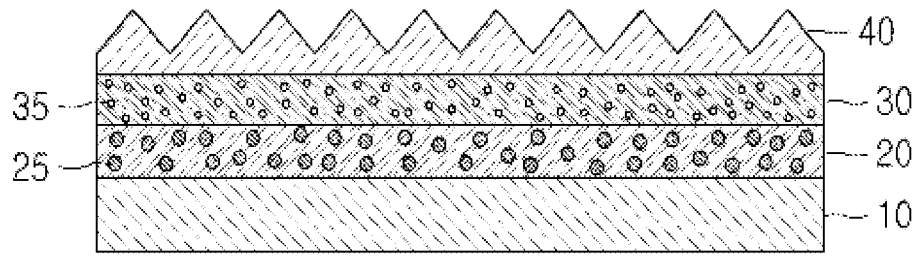
FIG. 1 is a cross-sectional view showing an optical sheet according to a first embodiment of the present invention.

10: substrate layer 20: light diffusion layer
25: light-diffusing particle 30: air layer
35: foam bead 40: light-collecting layer
50: particle dispersion layer

BEST MODE

Hereinafter, a detailed description will be given of the present invention.

According to an embodiment of the present invention, examples of an optical sheet include but are not limited to an optical sheet having a structured surface formed with predetermined patterns, namely, optical 3D patterns, which is composed of a single layer or multiple layers, and a multifunctional optical sheet having another functional layer. The structured surface may be formed through extrusion or stamping or may be formed of a curable resin obtained by imprinting an additional curable composition into predetermined patterns and then curing it, but the present invention is not limited thereto.

In the case where the structured surface of the optical sheet is formed with optical 3D patterns having a polygonal cross-section, the peaks of the structured surface are pointed and thus may be easily damaged due to external force or protruding particles. Thus, the optical sheet according to the embodiment of the present invention preferably has a damage resistance load of 20 g or more. As such, the damage resistance load is measured in a way such that a polyethyleneterephthalate film including a coating layer containing particles with a surface roughness of 0.5~15 μm and a hardness ranging from 2 B to 2 H is disposed on the structured surface of the optical sheet so that the coating layer thereof is in contact with the structured surface of the optical sheet, the optical sheet is pulled at a rate of 300 mm/min while applying a varying load to the polyethyleneterephthalate film, and a maximum value of the varying load is defined as the damage resistance load when the structured surface of the optical sheet has no substantial damage. In this case, the 'no substantial damage' will be understood as meaning that no scratches occur upon observation with the naked eye and neither cracks nor height changes of the 3D structures occur upon observation using an SEM. Upon observation using an SEM, the magnification may fall in the range of from ×50 to ×500.

Used in evaluation of the damage resistance load, the polyethyleneterephthalate film including a coating layer containing particles with a surface roughness Sz of 0.5~15 μm and a hardness ranging from 2 B to 2 H may be a film composed of a polyethyleneterephthalate substrate and a particle dispersion layer for imparting light diffusivity to the substrate, and commercially available examples of the film include LD10, LD14, and LD34, available from KOLON. The particle dispersion layer may be formed using a coating solution including a binder resin and light-diffusing particles. The surface roughness Sz may be measured using a laser microscope at a magnification of ×500 in such a way that heights at 10 points are measured in which 5 points have the highest values in order of height and the other 5 points have the lowest values in order of height and then the average height of the heights measured at the 10 points is obtained as the surface roughness, and the hardness may be measured according to a method of test for film hardness by pencil (ASTM 3363).

The optical sheet according to the embodiment of the present invention may have a damage resistance load of 20 g or more, preferably 30 g or more and more preferably 30~500 g. If the damage resistance load is less than 20 g, in the case where the optical sheet comes into contact with another film or is subjected to a load, the structured surface thereof may be cracked or distorted, undesirably making it difficult to exhibit the various functions of an optical sheet.

To realize an optical sheet satisfying such a damage resistance load, in a material for an optical sheet having a structured surface or a composition for forming an additional layer having a structured surface of the optical sheet, a material which mainly manifests properties of an elastomer rather than those of rubber within a range that does not impede optical properties is used. Briefly, a material having toughness and elasticity which are appropriately controlled is used.

Accordingly, a urethane acrylate-based compound, a styrene-based compound, a butadiene-based compound, an isoprene monomer or a silicone acrylate-based compound may be considered as a material for forming a structured surface. From the point of view of toughness, a bisphenol acrylate-based compound or a fluorene acrylate-based compound may be further contained. However, in the case where the above damage resistance load is satisfied, the curable monomer or oligomer contained in the material for forming the structured surface is not limited thereto.

A specific example of the curable composition may include a curable composition containing a urethane acrylate-based compound and a bisphenol acrylate-based compound as a UV curable oligomer and monomer.

The urethane acrylate-based compound for imparting the optical 3D patterns with elasticity is used in an amount of 10~80 parts by weight based on 100 parts by weight of a total solid content of the composition, thus achieving appropriate elasticity.

The bisphenol acrylate-based compound for improving toughness is used in an amount of 5~80 parts by weight based on 100 parts by weight of a total solid content of the composition, thus achieving appropriate toughness while elasticity is not impeded.

Specific examples of the bisphenol acrylate-based compound may include a bisphenol A acrylate-based compound, a bisphenol F acrylate-based compound, and a bisphenol S acrylate-based compound. Particularly useful is a bisphenol A acrylate-based compound.

For the purpose of the process of forming the optical 3D patterns, the curable composition may have a viscosity of 100~5,000 cps at 25° C.

Preferably, in order to improve toughness and reduce adhesion stains, the structured surface formed with optical 3D patterns may be prepared using a curable composition having a glass transition temperature of 40° C. or lower upon formation of a cured film while including such a material for forming the structured surface. If the coating solution has a glass transition temperature higher than 40° C. upon formation of a cured film, a layer having the structured surface loses elasticity and thus may result in surface damage thereof. Preferably, the glass transition temperature is set in the range of from −15° C. to 25° C.

The optical sheet according to the embodiment of the present invention may have a structured surface formed with a plurality of optical 3D patterns. The optical 3D patterns may be provided in a shape selected from among polyhedrons having a polygonal, semicircular or semi-elliptical cross-section, columns having a polygonal, semicircular or semi-elliptical cross-section, curved columns having a polygonal, semicircular or semi-elliptical cross-section, and combinations thereof.

Also, the optical 3D patterns may be configured in the form in which one or more concentric circles are arranged when viewed from above, with the ridges and valleys formed along the concentric circles.

In the case where the optical 3D patterns have a polygonal cross-section, luminance and light viewing angle remarkably vary depending on the angle of a vertex. In consideration of luminance and light viewing angle due to light collection, the angle of the vertex is set to 80~100°, and preferably to 85~95°.

In particular, in terms of the damage resistance load, even when the optical sheet has a structured surface imparted with column-shaped 3D structures having a triangular cross-section with a vertex angle of 90°, there is neither cracking nor distortion of the structured surface thereof.

A method of manufacturing the optical sheet according to the embodiment of the present invention is not particularly limited. For example, an optical sheet may be manufactured by mixing the UV curable oligomer or the UV curable monomer with an additive such as a UV curing agent and a photoinitiator, thus preparing a UV curable liquid composition, applying the liquid composition on a substrate layer and then curing it, or it may be formed through extrusion or stamping.

In addition, the multifunctional optical sheet may include an additional layer (hereinafter, referred to as "a light-collecting layer") having a structured surface with optical 3D patterns and a layer having another function, or which includes a light-collecting layer in which another function is imparted, while satisfying the above damage resistance load. The present invention is specified with reference to the appended drawings.

FIG. 1 is a cross-sectional view of a multifunctional optical sheet according to a preferred embodiment of the present invention, and FIGS. 2 to 7 are cross-sectional views of multifunctional optical sheets according to the other preferred embodiments of the present invention. In these drawings, the same elements are designated by the same reference numbers, but the compositions and shapes thereof are not necessarily identical.

The multifunctional optical sheet according to the present invention, including the light-collecting layer all the while still satisfying the above damage resistance load, is exemplified by an optical sheet composed of a substrate layer 10, a light diffusion layer 20 having light-diffusing particles 25 formed on at least one surface of the substrate layer 10, an air layer 30 having foam beads 35 formed on the light diffusion layer 20, and a light-collecting layer 40 formed on the air layer 30, as shown in FIG. 1.

Figure 2:
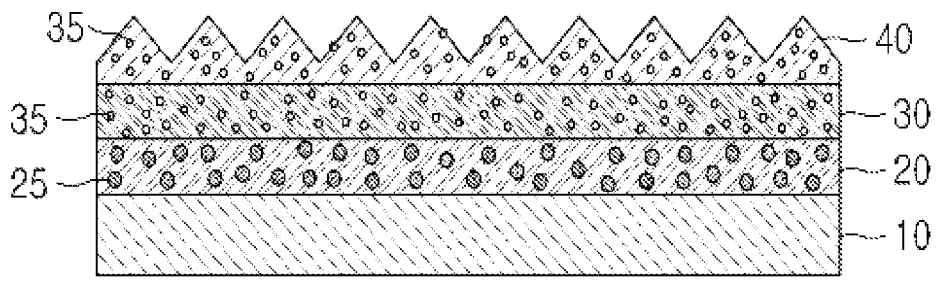
FIG. 2 is a cross-sectional view showing an optical sheet according to a second embodiment of the present invention.

As shown in FIG. 2, the light-collecting layer 40 may also contain foam beads 35.

Figure 3:
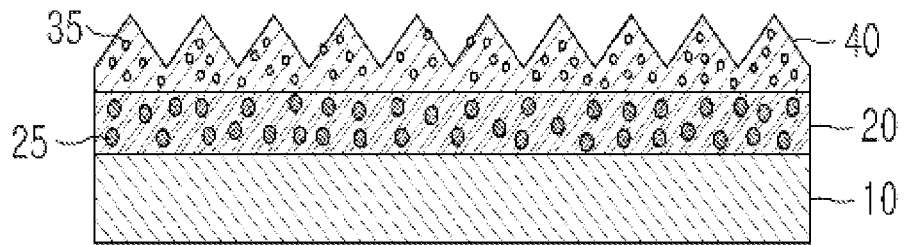
FIG. 3 is a cross-sectional view showing an optical sheet according to a third embodiment, of the present invention.
Figure 4:
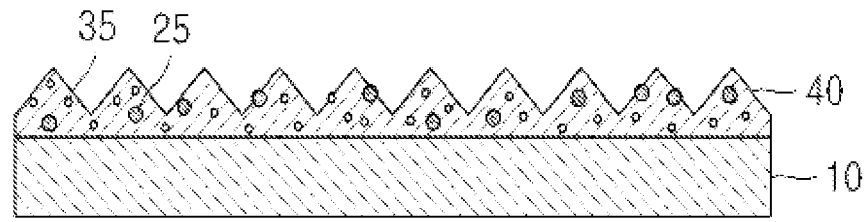
FIG. 4 is a cross-sectional view showing an optical sheet according to a fourth embodiment of the present invention.

Also, as shown in FIG. 3, an optical sheet may be configured such that a light diffusion layer having light-diffusing particles 25 is formed on at least one surface of the substrate layer 10, and a light-collecting layer 40 having foam beads 35 is formed on the light diffusion layer 20, without forming the air layer 30. Also, as shown in FIG. 4, the light diffusion layer 20 may be excluded.

Figure 5:
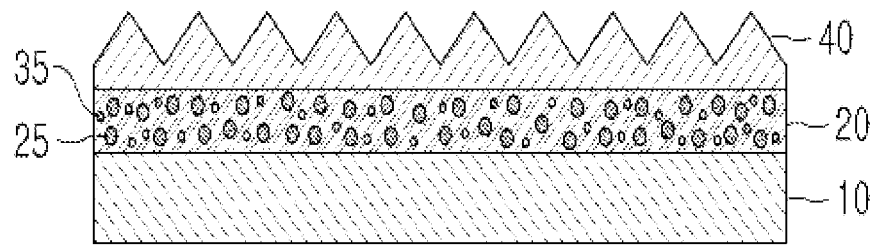
FIG. 5 is a cross-sectional view showing an optical sheet according to a fifth embodiment of the present invention.

Also, as shown in FIG. 5, an optical sheet may be configured such that a light diffusion layer 20 having both light-diffusing particles 25 and foam beads 35 is formed on at least one surface of a substrate layer 10 and a light-collecting layer 40 is formed on one surface of the light diffusion layer 20.

The optical sheets shown in FIGS. 1 to 5 typically include the foam beads 35. Upon manufacturing of the multifunctional optical sheet, a conventional problem of reducing luminance by excluding the air layer through adhesion of a light diffusion element and a prism sheet may be solved by using the foam beads 35.

As shown in FIG. 1, the light-diffusing particles 25 are provided on the substrate layer 10, thus exhibiting a light diffusion function, and simultaneously, the air layer 30 having the foam beads 35 is provided, thus preventing luminance from decreasing.

As shown in FIG. 2, the light-collecting layer 40 may additionally include the foam beads 35. In this case, luminance may be further increased.

The optical sheet shown in FIG. 3 includes the light-collecting layer 40 having the foam beads 35 with omission of the air layer 30. In this case, luminance may be slightly lower than that of FIG. 2 but is favorable in terms of reducing the manufacturing cost.

FIG. 4 shows the optical sheet configured such that the light-collecting layer 40 having the foam beads 35 and the light-diffusing particles 25 is formed on the substrate layer 10. This case may reduce luminance compared to that of the optical sheet including the light diffusion layer 20 or the air layer 30 additionally formed between the substrate layer 10 and the light-collecting layer 40 but may simplify the manufacturing process and thus may advantageously reduce defective rates.

FIG. 5 shows the optical sheet including the light diffusion layer 20 having the foam beads 35 and the light-diffusing particles 25. This case may increase luminance because a light source diffused through the light-diffusing particles is refracted through the air layer of the foam beads disposed adjacent to the light-diffusing particles to thus collect the light path in a front-surface direction.

The foam beads 35 may be formed by mixing a resin composition or binder resin for forming a layer containing the foam beads with a foaming agent thus preparing a mixture, applying the mixture, and applying heat, thus foaming the foaming agent. Specifically, the resin composition or binder resin for forming the layer containing the foam beads 35, for example, the light diffusion layer 20, the air layer 30 or the light-collecting layer 40, is mixed with a foaming agent, thus preparing a mixture, which is then applied on a predetermined surface, namely, the surface of the light diffusion layer 30 or the substrate layer 10, followed by applying heat so that the foaming agent is evaporated and foamed. The foaming agent is provided in the form of beads having a double structure composed of a core and a shell. While the foaming agent is evaporated, the core thereof is expanded thus forming the foam beads 35 containing air. As such, in order to form an air layer adapted for causing a refraction effect through foaming, the foam beads preferably have a diameter of 2~100 μm, which corresponds to 1.2~2 times the diameter of the foaming agent before being foamed. Also, in the case where the layer having the foam beads 35 is the light diffusion layer or the air layer, the foam beads may be used in an amount of 30~300 parts by weight based on 100 parts by weight of the binder resin. In the case where the layer having the foam beads 35 is the light-collecting layer 40, the foam beads may be used in an amount of 1~30 parts by weight based on 100 parts by weight of the curable resin composition.

The foaming agent having the above function is not particularly limited, but the use of isobutane or isopentane is preferable. For appropriate foaming of the foaming agent, heat at 60~200° C. may be applied for 3~300 seconds. Further, the foaming agent may be foamed even by heat of a UV curable lamp additionally generated upon photocuring.

In the case where the air layer 30 having the foam beads 35 is formed, the binder resin for the air layer 30 may include acrylic polyol, or alternately may be selected from among resin materials useful as the binder resin for the light diffusion layer which will be described later.

The mixture composed of the binder resin and the foaming agent is foamed, thus forming the foam beads 35. As such, the air layer 30 may have a thickness of 2~100 μm.

Figure 6:
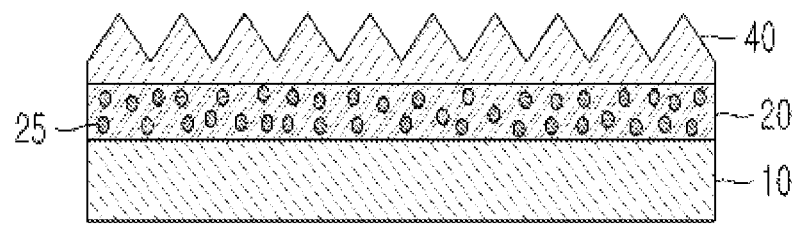
FIG. 6 is a cross-sectional view showing an optical sheet according to a sixth embodiment of the present invention.
Figure 7:
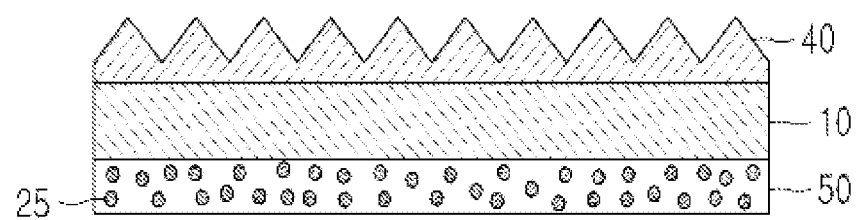
FIG. 7 is a cross-sectional view showing an optical sheet according to a seventh embodiment of the present invention.
Figure 8:
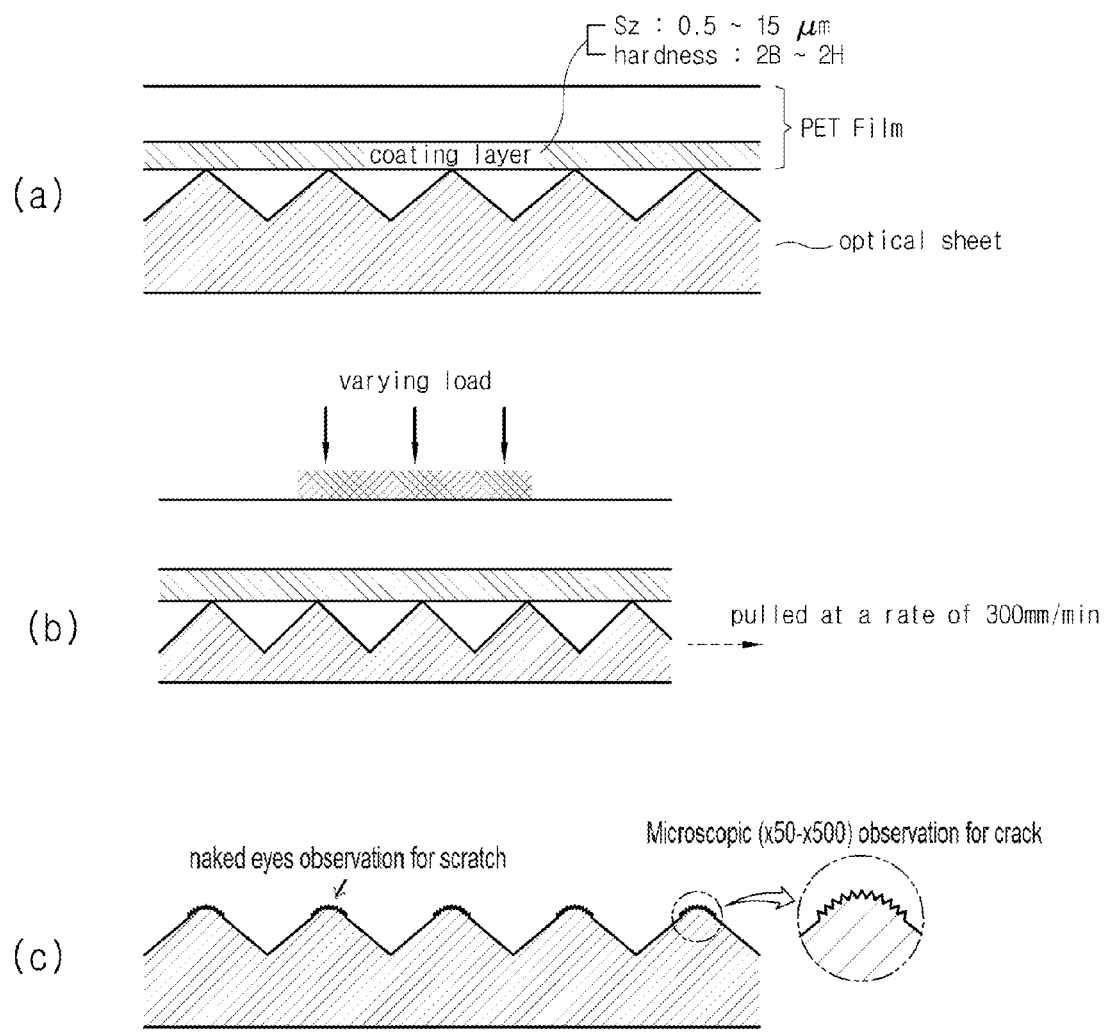
FIG. 8($a$)-($c$) depict the steps of measuring the damage resistance load of the optical sheet according to embodiments of the invention.

In addition, in the case where the multifunctional optical sheet according to the present invention satisfies the above damage resistance load, it may be configured such that the light diffusion layer 20 is formed on one surface of the substrate layer 10 and the light-collecting layer 40 is formed on the light diffusion layer 20, or such that a particle dispersion layer 50 having light-diffusing particles 25 is formed on one surface of the substrate layer 10 and the light-collecting layer 40 is formed on the other surface of the substrate layer, as shown in FIG. 6 or 7.

In the case where the particle dispersion layer 50 is formed on the lower surface of the substrate layer 10, hiding performance may be improved.

In the optical sheet according to the present invention, the substrate layer 10 may be formed of one or more materials selected from the group consisting of polyethyleneterephthalate, polyethylenenaphthalate, polycarbonate, polystyrene, polymethacrylate, polymethylmethacrylate, polyacrylate, polyimide and polyamide, but the present invention is not limited thereto. Particularly useful is a polyethyleneterephthalate film or a polycarbonate film. Also, light-diffusing particles may be further used depending on the needs, thus forming irregularities. The thickness of the substrate layer 10 may be set to 10-1000 μm and preferably 15-400 μm, in terms of exhibiting mechanical strength, thermal stability, and film flexibility and also of preventing the loss of transmitted light.

In the case where the light diffusion layer 20 is formed, the light diffusion layer 20 is formed by dispersing the light-diffusing particles 25 in the binder resin thereof. The binder resin includes a resin that adheres well to the substrate layer 10 and has good compatibility with the light-diffusing particles 25 dispersed therein, for example, a resin in which the light-diffusing particles 25 are uniformly dispersed so that they do not separate or precipitate. Examples of the binder resin include acrylic resin including homopolymers, copolymers or terpolymers of unsaturated polyester, methyl methacrylate, ethyl methacrylate, isobutyl methacrylate, n-butyl methacrylate, acrylic acid, methacrylic acid, hydroxyethyl methacrylate, hydroxypropyl methacrylate, hydroxyethyl acrylate, acrylamide, methylolacrylamide, glycidyl methacrylate, ethyl acrylate, isobutyl acrylate, n-butyl acrylate and 2-ethylhexyl acrylate, urethane resin, epoxy resin, and melamine resin.

The light-diffusing particles 25 include various organic or inorganic particles. Examples of the organic particles include acrylic particles including homopolymers or copolymers of methyl methacrylate, acrylic acid, methacrylic acid, hydroxyethyl methacrylate, hydroxypropyl methacrylate, acrylamide, methylolacrylamide, glycidyl methacrylate, ethyl acrylate, isobutyl acrylate, n-butyl acrylate and 2-ethylhexyl acrylate, olefin particles including polyethylene, polystyrene and polypropylene, acryl-olefin copolymer particles, and multilayer multicomponent particles prepared by forming a layer of homopolymer particles and then forming a layer of another type of monomer thereon. Examples of the inorganic particles include silicon oxide, aluminum oxide, titanium oxide, zirconium oxide and magnesium fluoride. Such organic and inorganic particles are merely illustrative, are not limited to the examples listed above, and may be replaced with other known materials as long as the main purpose of the present invention is achieved, as will be apparent to those skilled in that art. The case in which the type of material is changed also falls within the technical scope of the present invention.

The light-diffusing particles 25 may be dispersed in a single layer or multiple layers, and may have a diameter of 1~80 μm. The light-diffusing particles are used in an amount of 50~300 parts by weight based on 100 parts by weight of the binder resin. In the case where the light-diffusing particles having the above diameter are used in the above amount, white turbidity and separation of the particles can be prevented and appropriate light diffusion effects can be realized. The thickness of the light diffusion layer 20 may be set to 5~100 μm.

The components for the particle dispersion layer 50 remain the same as the binder resin and the light-diffusing particles 25 used to form the light diffusion layer 20, and the thickness of the particle dispersion layer may be set to 1~100 μm.

The light-collecting layer 40 is as mentioned above.

In the multifunctional optical sheet manufactured as above, the light-diffusing particles 25 function to uniformly diffuse light passed through the substrate layer 10, and the foam beads 35 functioning as the air layer play a role in preventing the reduction of luminance and aiding the diffusion of light. The light thus diffused and refracted is directly passed through the light-collecting layer 40, and thus the loss of light is drastically reduced compared to conventional cases. Hence, in the present invention, sheets which are conventionally separately provided to impart the diffusion of light and the increase in luminance can be manufactured at the same time. A sheet configured to include such a multifunctional sheet can exhibit luminance approximately equivalent to that of conventional cases in which a light diffusion element and a prism sheet are separately used, and also, can diffuse light, thus improving hiding performance and thereby reducing the manufacturing process and the manufacturing cost. In an optical sheet assembly for a backlight unit, the number of mounted sheets can be desirably reduced.

Mode for Invention

A better understanding of the present invention may be obtained through the following examples, which are set forth to illustrate, but are not to be construed as limiting the present invention.

In the following examples, a glass transition temperature of a cured film obtained from a coating solution was measured through DSC (Differential Scanning Calorimetry) according to ASTM E1356. As such, the cured film was obtained by applying the coating solution on glass using a bar coater and then radiating light at 900 mJ/cm$^2$ using a UV radiation system (600 W/inch$^2$, available from FUSION).

The viscosity of the coating solution was measured at 25° C. using a viscometer (available from BROOKFIELD).

Preparation of Urethane Acrylate Oligomer

Synthesis Example 1

In a 1000 ml four-neck flask equipped with an oil bath, a thermometer, a reflux condenser, and a dropping funnel, 0.195 mol ether-based polyol (PPG, Lupranol 1100, available from BASF), 0.243 mol 1,6-hexanediol, and 0.03 g of dibutyltin dilaurate as a reaction catalyst were placed, and then mixed with stirring at about 70~80° C. for 30 min, after which 2.154 mol diphenylmethane diisocyanate was added in 2~3 separate steps at intervals of about 1 hour. Then, reaction was allowed to occur for a total of about 5 hours, thus preparing a urethane prepolymer having an isocyanate end. The R(N=C=O/OH, the ratio of isocyanate group to hydroxyl group) of the prepolymer having an isocyanate end was about 1.66, and the ratio of HS (Hard Segment)/SS (Soft Segment) of the urethane prepolymer was about 1/3.9.

Thereafter, in order to prevent the thermal polymerization of the vinyl group, the temperature of the reactor was lowered to about 50° C., and 0.657 mol hydroxyethylacrylate was added thereto, after which stirring was conducted for 4~6 hours until isocyanate groups were completely consumed. From an FT-IR spectrum, isocyanate having an intrinsic peak of N=C=O near 2270 cm$^{-1}$ was observed to be absent, after which the reaction was terminated, thereby obtaining a urethane acrylate oligomer.

Synthesis Example 2

A urethane acrylate oligomer was prepared in the same manner as in Synthesis Example 1, with the exception that a urethane prepolymer obtained by adjusting the proportions of polyol, chain extender and diphenylmethane diisocyanate so that the ratio of HS/SS was about 1/2.65 was used.

Synthesis Example 3

A urethane acrylate oligomer was prepared in the same manner as in Synthesis Example 1, with the exception that a urethane prepolymer obtained by adjusting the proportions of polyol, chain extender and diphenylmethane diisocyanate so that the ratio of HS/SS was about 1/1.51 was used.

Synthesis Example 4

A urethane acrylate oligomer was prepared in the same manner as in Synthesis Example 1, with the exception that a urethane prepolymer obtained by adjusting the proportions of polyol, chain extender and diphenylmethane diisocyanate so that the ratio of HS/SS was about 1/1.32 was used.

Manufacture of Optical Sheet

Example 1

Based on 100 parts by weight of a total solid content, 60 parts by weight of the urethane acrylate oligomer of Synthesis Example 1, 10 parts by weight of bisphenol A acrylate, 10 parts by weight of phenoxyethyl methacrylate (SR340, available from SARTOMER), 15 parts by weight of phenoxyethyl acrylate (SR339, available from SARTOMER), 1.5 parts by weight of 2,4,6-trimethylbenzoyldiphenylphosphine oxide as a photoinitiator, 1.5 parts by weight of methyl benzoylformate as a photoinitiator, and 2.0 parts by weight of bis(1,2,2,6,6-pentamethyl-4-piperidyl)sebacate as an additive were mixed at 60° C. for 1 hour, thus preparing a composition (a glass transition temperature was −30° C. or lower upon formation of a cured film, and a viscosity of a coating solution was 3500 cps at 25° C.).

Thereafter, the composition thus obtained was applied on one surface of a polyethyleneterephthalate (PET) film (available from KOLON) as a substrate layer, the frame of a prism-shaped roller was covered therewith at 35° C., and then UV light was radiated onto the outer surface of the substrate layer at 900 mJ/cm$^2$ using a UV radiation system (600 W/inch$^2$, available from FUSION) provided with a Type-D bulb, thus forming linear triangular prisms having a vertex angle of 90°, a pitch of 50 μm, and a height of 25 μm, thereby manufacturing an optical sheet.

Example 2

An optical sheet was manufactured in the same manner as in Example 1, with the exception that 50 parts by weight of the urethane acrylate oligomer and 20 parts by weight of bisphenol A acrylate were used. As such, the coating solution had a viscosity of 2200 cps at 25° C., and upon formation of a cured film, the glass transition temperature was 2° C.

Example 3

An optical sheet was manufactured in the same manner as in Example 1, with the exception that 40 parts by weight of the urethane acrylate oligomer and 30 parts by weight of bisphenol A acrylate were used. As such, the coating solution had a viscosity of 1300 cps at 25° C., and upon formation of a cured film, the glass transition temperature was 12° C.

Example 4

An optical sheet was manufactured in the same manner as in Example 1, with the exception that 30 parts by weight of the urethane acrylate oligomer and 40 parts by weight of bisphenol A acrylate were used. As such, the coating solution had a viscosity of 950 cps at 25° C., and upon formation of a cured film, the glass transition temperature was 25° C.

Example 5

An optical sheet was manufactured in the same manner as in Example 1, with the exception that 20 parts by weight of the urethane acrylate oligomer and 50 parts by weight of bisphenol A acrylate were used. As such, the coating solution had a viscosity of 720 cps at 25° C., and upon formation of a cured film, the glass transition temperature was 38° C.

Example 6

An optical sheet was manufactured in the same manner as in Example 1, with the exception that the urethane acrylate oligomer of Synthesis Example 2 was used as the urethane oligomer. As such, the coating solution had a viscosity of 3300 cps at 25° C., and upon formation of a cured film, the glass transition temperature was −15° C.

Example 7

An optical sheet was manufactured in the same manner as in Example 1, with the exception that the urethane acrylate oligomer of Synthesis Example 3 was used as the urethane oligomer. As such, the coating solution had a viscosity of 3100 cps at 25° C., and upon formation of a cured film, the glass transition temperature was −13° C.

Example 8

An optical sheet was manufactured in the same manner as in Example 1, with the exception that the urethane acrylate oligomer of Synthesis Example 4 was used as the urethane oligomer. As such, the coating solution had a viscosity of 3100 cps at 25° C., and upon formation of a cured film, the glass transition temperature was −10° C.

Comparative Example 1

As an optical sheet, a BEFIII prism film, available from 3M, was used.

Comparative Example 2

As an optical sheet, a Brite-200 prism film, available from DOOSAN, was used.

Comparative Example 3

As an optical sheet, a LES-T2 prism film, available from LG, was used.

The damage resistance load, scratch resistance, adhesion and luminance of the optical sheet of each of the above examples and comparative examples were measured through the following methods.

(1) Damage Resistance Load

A. 1$^{st}$ Test: A PET film, for example, a commercially available LD14 film (coating layer: surface roughness Sz=2.3 μm, hardness F, available from KOLON) was disposed on the optical sheet (size: 30 cm×10 cm) of each of the examples and comparative examples so that a coating layer thereof was in contact with the structured surface of the optical sheet.

Thereafter, a counterweight having a predetermined load was placed on the PET film, after which the optical sheet was pulled at a rate of 300 mm/min. The structured surface of the optical sheet was observed with the naked eye and using an SEM (S4300, available from HITACHI). As such, to pull the optical sheet at a predetermined rate, a friction coefficient meter (available from TOYOSEIKI) was used.

While the load of the counterweight was changed, the maximum load at which the structured surface of the optical sheet was not substantially damaged was measured and thus determined as the damage resistance load.

The analysis using an SEM was conducted at a magnification of ×300.

B. 2$^{nd}$ Test: A commercially available LD10 film (coating layer: surface roughness Sz=5.5 μm, hardness F, size 30 cm×10 cm, available from KOLON) was disposed on the optical sheet of each of the examples and comparative examples so that a coating layer thereof was in contact with the structured surface of the optical sheet.

A damage resistance load was measured in the same manner as in the 1$^{st}$ test with the exception that the different PET film as above was used.

C. 3$^{rd}$ Test: A commercially available LD34 film (coating layer: surface roughness Sz=10.5 μm, hardness F, size 30 cm×10 cm, available from KOLON) was disposed on the optical sheet of each of the examples and comparative examples so that a coating layer thereof was in contact with the structured surface of the optical sheet.

A damage resistance load was measured in the same manner as in the 1$^{st}$ test with the exception that the different PET film as above was used.

(2) Scratch Resistance

When minimum pressure was applied to the optical sheet of each of the examples and comparative examples using a standard weight of a Big Heart tester available from IMOTO, whether the structured surface was scratched or not was checked. The results are shown in Table 1 below. The degree of damage was observed with the naked eye and was then evaluated according to the following:

Poor scratch resistance←x<Δ<○<◉→good scratch resistance (3) Degree of Adhesion after High Temperature and High Humidity The optical sheet of each of the examples and comparative examples was mounted in a module state under conditions of a temperature of 60° C., humidity of 80% and 250 hours, after which the degree of adhesion thereof was evaluated.

No adhesion: ◉, low adhesion: ○, medium adhesion: Δ, high adhesion: x (4) Luminance The optical sheet of each of the examples and comparative examples was mounted on a backlight unit (model number: LM170E01, available from HEESUNG ELECTRONICS, Korea) for 17" LCD panels, and the luminance values of 13 random points were measured using a luminance meter (model number: BM-7, available from TOPCON, Japan), and then averaged.

TABLE 1

| Ex. No. | Damage Resistance Load (g) | | | Scratch Resistance | Degree of Adhesion | Luminance (cd/m²) |
|---|---|---|---|---|---|---|
| | 1$^{st}$ Test | 2$^{nd}$ Test | 3$^{rd}$ Test | | | |
| 1 | 250 g | 200 g | 150 g | ◉ | ◉ | 2430 |
| 2 | 220 g | 180 g | 100 g | ○ | ◉ | 2435 |
| 3 | 170 g | 150 g | 70 g | ○ | ◉ | 2438 |
| 4 | 100 g | 70 g | 50 g | ○ | ◉ | 2440 |
| 5 | 50 g | 30 g | 20 g | Δ | ◉ | 2445 |
| 6 | 270 g | 210 g | 170 g | ◉ | ◉ | 2425 |
| 7 | 300 g | 230 g | 200 g | ◉ | ◉ | 2418 |
| 8 | 300 g | 250 g | 210 g | ◉ | ◉ | 2401 |
| C. 1 | 10 g | 7 g | 3 g | X | ◉ | 2494 |
| C. 2 | 10 g | 5 g | 3 g | X | ◉ | 2476 |
| C. 3 | 10 g | 5 g | 3 g | X | ◉ | 2466 |

As is apparent from Table 1, the optical sheets according to the present invention having 3D patterns formed using the composition having elasticity and toughness had a damage resistance load of 20 g or more under an extreme environment, with superior scratch resistance. Also, the intrinsic luminance of the optical sheets was seen to be appropriate.

Thus, even when the optical sheet according to the present invention was subjected to external predetermined force, neither cracking nor distortion of the structured surface thereof occurred, resulting in no damage to the structured surface. Thereby, a decrease in luminance caused by damage to the structured surface could be expected to be prevented.

Example 9

Based on 100 parts by weight of a total solid content, 70 parts by weight of the urethane acrylate oligomer of Synthesis Example 1, 10 parts by weight of phenoxyethyl methacrylate (SR340, available from SARTOMER), 15 parts by weight of phenoxyethyl acrylate (SR339, available from SARTOMER), 1.5 parts by weight of 2,4,6-trimethylbenzoyl-diphenylphosphine oxide as a photoinitiator, 1.5 parts by weight of methyl benzoylformate as a photoinitiator, and 2.0 parts by weight of bis(1,2,2,6,6-pentamethyl-4-piperidyl)sebacate as an additive were mixed at 60° C. for 1 hour, thus preparing a composition (a glass transition temperature was −30° C. or lower upon formation of a cured film, and a viscosity of a coating solution was 4400 cps at 25° C.).

Thereafter, the composition thus obtained was applied on one surface of a PET film (available from KOLON) as a substrate layer, the frame of a prism-shaped roller was covered therewith at 35° C., and then UV light was radiated onto the outer surface of the substrate layer at 900 mJ/cm² using a UV radiation system (600 W/inch², available from FUSION) provided with a Type-D bulb, thus forming linear triangular prisms having a vertex angle of 90°, a pitch of 50 μm, and a height of 25 μm, thereby manufacturing an optical sheet.

Example 10

An optical sheet was manufactured in the same manner as in Example 9, with the exception that lenticular lenses having a semicircular cross-section, a pitch of 50 μm, and a height of 25 μm were formed, instead of the linear triangular prisms.

Example 11

An optical sheet was manufactured in the same manner as in Example 9, with the exception that linear prisms having a semicircular cross-section, a pitch of 50 μm, and a height of 25 μm were formed, instead of the linear triangular prisms.

Example 12

An optical sheet was manufactured in the same manner as in Example 9, with the exception that linear, prisms having a pentagonal cross-section, a vertex angle of 95°, a pitch of 50 μm, and a height of 25 μm were formed, instead of the linear triangular prisms.

Example 13

An optical sheet was manufactured in the same manner as in Example 9, with the exception that curved prisms having a semicircular cross-section, a pitch of 50 μm, and a height of 25 μm were formed, instead of the linear triangular prisms.

Example 14

An optical sheet was manufactured in the same manner as in Example 9, with the exception that the urethane acrylate oligomer of Synthesis Example 2 was used as the urethane acrylate oligomer. As such, the coating solution had a viscosity of 3900 cps at 25° C., and upon formation of a cured film, the glass transition temperature was −22° C.

Example 15

An optical sheet was manufactured in the same manner as in Example 9, with the exception that the urethane acrylate oligomer of Synthesis Example 3 was used as the urethane acrylate oligomer. As such, the coating solution had a viscosity of 3400 cps at 25° C., and upon formation of a cured film, the glass transition temperature was −15° C.

Example 16

An optical sheet was manufactured in the same manner as in Example 9, with the exception that the urethane acrylate oligomer of Synthesis Example 4 was used as the urethane acrylate oligomer. As such, the coating solution had a viscosity of 3300 cps at 25° C., and upon formation of a cured film, the glass transition temperature was −7° C.

The damage resistance load, scratch resistance, degree of adhesion and luminance of the optical sheet of each of Examples 9 to 16 were measured through the above methods. The results are shown in Table 2 below.

TABLE 2

| Ex. No. | Damage Resistance Load (g) | | | Scratch Resistance | Degree of Adhesion | Luminance (cd/m$^2$) |
|---|---|---|---|---|---|---|
| | 1$^{st}$ Test | 2$^{nd}$ Test | 3$^{rd}$ Test | | | |
| 9 | 450 g | 350 g | 250 g | ◎ | ○ | 2425 |
| 10 | 550 g | 500 g | 400 g | ◎ | Δ | 2245 |
| 11 | 500 g | 450 g | 400 g | ◎ | Δ | 2106 |
| 12 | 400 g | 350 g | 300 g | ◎ | ○ | 2410 |
| 13 | 350 g | 300 g | 250 g | ◎ | ○ | 2418 |
| 14 | 270 g | 250 g | 200 g | ◎ | ○ | 2401 |
| 15 | 250 g | 230 g | 180 g | ◎ | ○ | 2364 |
| 16 | 230 g | 200 g | 150 g | ◎ | ◎ | 2347 |
| C. 1 | 10 g | 7 g | 3 g | X | ◎ | 2494 |
| C. 2 | 10 g | 5 g | 3 g | X | ◎ | 2476 |
| C. 3 | 10 g | 5 g | 3 g | X | ◎ | 2466 |

As is apparent from Table 2, the optical sheets according to the present invention having a damage resistance load of 20 g or more had superior scratch resistance of the structured surface. Also, the intrinsic luminance of the optical sheets was seen to be appropriate.

Thus, even when the optical sheet according to the embodiment of the present invention was subjected to external predetermined force, neither cracking nor distortion of the structured surface thereof occurred, resulting in no damage to the structured surface. Thereby, a decrease in luminance caused by damage to the structured surface could be expected to be prevented.

Example 17

100 parts by weight of acrylic resin (52-666, available from AEKYUNG CHEMICAL) was diluted with 30 parts by weight of methylethylketone and 80 parts by weight of toluene, thus preparing a binder resin having a refractive index of 1.49. Thereafter, spherical polymethylmethacrylate particles (MH20F, available from KOLON) having an average diameter of 20 μm and a refractive index of 1.49 were added to the binder resin in an amount of 150 parts by weight based on the amount of the binder resin and then monodispersed in a single layer using a milling machine, after which the dispersion thus obtained was applied on one surface of a super-transparent PET film (FHSS, available from KOLON) 188 μm thick as a substrate layer using a gravure coater and then cured at 120° C. for 60 sec, thus forming a light diffusion layer (refractive index: 1.49) having a dry thickness of 25 μm.

Further, on one surface of the cured light diffusion layer, an air layer was formed through the following procedures. Specifically, 100 parts by weight of acrylic resin (52-666, available from AEKYUNG CHEMICAL) was diluted with 50 parts by weight of methylethylketone and 90 parts by weight of toluene, thus preparing a binder resin having a refractive index of 1.49. Thereafter, isobutane particles were added to the binder resin in an amount of 50 parts by weight based on 100 parts by weight of the binder resin and then monodispersed in a single layer using a milling machine, after which the dispersion thus obtained was applied using a gravure coater to form a dry thickness of 20 μm. After gravure coating, heat treatment at 120° C. for 60 sec was performed, thus obtaining the air layer containing the isobutane particles having an average diameter of 15 μm.

Furthermore, on one surface of the air layer, a light-collecting layer was formed through the following procedures. Specifically, 70 parts by weight of the urethane acrylate oligomer of Synthesis Example 1, 10 parts by weight of phenoxyethyl methacrylate (SR340, available from SARTOMER), 15 parts by weight of phenoxyethyl acrylate (SR339, available from SARTOMER), 1.5 parts by weight of 2,4,6-trimethylbenzoyldiphenylphosphine oxide as a photoinitiator, 1.5 parts by weight of methyl benzoylformate as a photoinitiator, and 2.0 parts by weight of bis(1,2,2,6,6-pentamethyl-4-piperidyl)sebacate as an additive were mixed at 60° C. for 1 hour, thus preparing a curable composition (upon formation of a cured film, the glass transition temperature was −30° C. or lower, and the viscosity of the coating solution was 4400 cps at 25° C.). Thereafter, the composition thus obtained was applied on one surface of the air layer, the frame of a prism-shaped roller was covered therewith at 35° C., and then UV light was radiated onto the outer surface of the substrate layer at 900 mJ/cm$^2$ using a UV radiation system (600 W/inch$^2$, available from FUSION) provided with a Type-D bulb, thus forming linear triangular prisms having a vertex angle of 90°, a pitch of 50 μm, and a height of 25 μm, thereby manufacturing an optical sheet.

Example 18

An optical sheet was manufactured in the same manner as in Example 17, with the exception that, in the formation of the light-collecting layer, lenticular lenses having a semicircular cross-section, a pitch of 50 μm, and a height of 25 μm were formed, instead of the linear triangular prisms.

Example 19

An optical sheet was manufactured in the same manner as in Example 17, with the exception that, in the formation of the light-collecting layer, linear prisms having a semicircular cross-section, a pitch of 50 μm, and a height of 25 μm were formed, instead of the linear triangular prisms.

Example 20

An optical sheet was manufactured in the same manner as in Example 17, with the exception that, in the formation of the light-collecting layer, linear prisms having a pentagonal cross-section, a vertex angle of 95°, a pitch of 50 μm, and a height of 25 μm were formed, instead of the linear triangular prisms.

Example 21

An optical sheet was manufactured in the same manner as in Example 17, with the exception that, in the formation of the light-collecting layer, curved prisms having a semicircular cross-section, a pitch of 50 μm, and a height of 25 μm were formed, instead of the linear triangular prisms.

Example 22

An optical sheet was manufactured in the same manner as in Example 17, with the exception that, in the formation of the light-collecting layer, a curable composition was prepared using the urethane acrylate oligomer of Synthesis Example 2.

As such, the coating solution had a viscosity of 3900 cps at 25° C., and upon formation of a cured film, the glass transition temperature was −22° C.

Example 23

An optical sheet was manufactured in the same manner as in Example 17, with the exception that, in the formation of the light-collecting layer, a curable composition was prepared using the urethane acrylate oligomer of Synthesis Example 3. As such, the coating solution had a viscosity of 3700 cps at 25° C., and upon formation of a cured film, the glass transition temperature was −15° C.

Example 24

An optical sheet was manufactured in the same manner as in Example 17, with the exception that, in the formation of the light-collecting layer, a curable composition was prepared using the urethane acrylate oligomer of Synthesis Example 4. As such, the coating solution had a viscosity of 3300 cps at 25° C., and upon formation of a cured film, the glass transition temperature was −7° C.

Example 25

An optical sheet was manufactured in the same manner as in Example 17, with the exception that, in the formation of the light-collecting layer, a curable composition was prepared using 60 parts by weight of the urethane acrylate oligomer and 10 parts by weight of bisphenol A acrylate, instead of 70 parts by weight of the urethane acrylate oligomer. As such, the coating solution had a viscosity of 2500 cps at 25° C., and upon formation of a cured film, the glass transition temperature was 2° C.

Example 26

An optical sheet was manufactured in the same manner as in Example 17, with the exception that, in the formation of the light-collecting layer, a curable composition was prepared using 50 parts by weight of the urethane acrylate oligomer and 20 parts by weight of bisphenol A acrylate, instead of 70 parts by weight of the urethane acrylate oligomer. As such, the coating solution had a viscosity of 1500 cps at 25° C., and upon formation of a cured film, the glass transition temperature was 9° C.

Example 27

An optical sheet was manufactured in the same manner as in Example 17, with the exception that, in the formation of the light-collecting layer, a curable composition was prepared using 40 parts by weight of the urethane acrylate oligomer and 30 parts by weight of bisphenol A acrylate, instead of 70 parts by weight of the urethane acrylate oligomer. As such, the coating solution had a viscosity of 1300 cps at 25° C., and upon formation of a cured film, the glass transition temperature was 15° C.

Example 28

An optical sheet was manufactured in the same manner as in Example 17, with the exception that, in the formation of the light-collecting layer, a curable composition was prepared using 30 parts by weight of the urethane acrylate oligomer and 40 parts by weight of bisphenol A acrylate, instead of 70 parts by weight of the urethane acrylate oligomer. As such, the coating solution had a viscosity of 1020 cps at 25° C., and upon formation of a cured film, the glass transition temperature was 25° C.

Example 29

An optical sheet was manufactured in the same manner as in Example 17, with the exception that, in the formation of the light-collecting layer, a curable composition was prepared using 20 parts by weight of the urethane acrylate oligomer and 50 parts by weight of bisphenol A acrylate, instead of 70 parts by weight of the urethane acrylate oligomer. As such, the coating solution had a viscosity of 800 cps at 25° C., and upon formation of a cured film, the glass transition temperature was 38° C.

Example 30

An optical sheet was manufactured in the same manner as in Example 17, with the exception that, in the formation of the air layer, the isobutane particles were used in an amount of 100 parts by weight based on 100 parts by weight of the binder resin.

Example 31

An optical sheet was manufactured in the same manner as in Example 17, with the exception that the air layer was not formed.

Example 32

100 parts by weight of acrylic resin (52-666, available from AEKYUNG CHEMICAL) was diluted with 30 parts by weight of methylethylketone and 80 parts by weight of toluene, thus preparing a binder resin having a refractive index of 1.49. Thereafter, spherical polymethylmethacrylate particles (MH20F, available from KOLON) having an average diameter of 20 μm and a refractive index of 1.49 were added to the binder resin in an amount of 150 parts by weight based on the amount of the binder resin and then monodispersed in a single layer using a milling machine, after which the dispersion thus obtained was applied on one surface of a super-transparent PET film (FHSS, available from KOLON) 188 μm thick as a substrate layer using a gravure coater and then cured at 120° C. for 60 sec, thus forming a light diffusion layer (refractive index: 1.49) having a dry thickness of 25 μm.

Further, on one surface of the cured light diffusion layer, an air layer was formed through the following procedures. Specifically, 100 parts by weight of acrylic resin (52-666, available from AEKYUNG CHEMICAL) was diluted with 50 parts by weight of methylethylketone and 90 parts by weight of toluene, thus preparing a binder resin having a refractive index of 1.49. Thereafter, isobutane particles were added to the binder resin in an amount of 50 parts by weight based on 100 parts by weight of the binder resin and then monodispersed in a single layer using a milling machine, after which the dispersion thus obtained was applied using a gravure coater to form a dry thickness of 20 μm. After gravure coating, heat treatment at 120° C. for 60 sec was performed, so that an average diameter of the isobutane particles was 15 μm.

Furthermore, on one surface of the air layer, a light-collecting layer was formed through the following procedures. Specifically, 100 parts by weight of a curable composition composed of 40 parts by weight of the urethane acrylate oligomer of Synthesis Example 1, 30 parts by weight of bisphenol A acrylate, 10 parts by weight of phenoxyethyl methacrylate (SR340, available from SARTOMER), 15 parts by weight of phenoxyethyl acrylate (SR339, available from SARTOMER), 1.5 parts by weight of 2,4,6-trimethylbenzoyldiphenylphosphine oxide as a photoinitiator, 1.5 parts by weight of methyl benzoylformate as a photoinitiator, and 2.0 parts by weight of bis(1,2,2,6,6-pentamethyl-4-piperidyl)sebacate as an additive was added with 5 parts by weight of polymethylmethacrylate particles (MH20F, available from KOLON) and 5 parts by weight of isobutane particles, and then mixed at 60° C. for 1 hour, thus preparing a composition (upon formation of a cured film, the glass transition temperature was 15° C., and the viscosity of a coating solution was 3300 cps at 25° C.). Thereafter, the composition thus obtained was applied on the air layer, the frame of a prism-shaped roller was covered therewith at 35° C., and then UV light was radiated onto the outer surface of the substrate layer at 900 mJ/cm$^2$ using a UV radiation system (600 W/inch$^2$, available from FUSION) provided with a Type-D bulb, thus forming linear triangular prisms having a vertex angle of 90°, a pitch of 50 μm, and a height of 25 μm and simultaneously foaming the isobutane particles using heat (150° C., 5 sec) generated from a UV curable lamp so that an average diameter thereof was 15 μm, thereby forming the light-collecting layer having a refractive index of 1.56.

Example 33

An optical sheet was manufactured in the same manner as in Example 32, with the exception that the light-collecting layer was formed on the light diffusion layer, without forming the air layer.

Example 34

100 parts by weight of a curable composition composed of 40 parts by weight of the urethane acrylate oligomer of Synthesis Example 1, 30 parts by weight of bisphenol A acrylate, 10 parts by weight of phenoxyethyl methacrylate (SR340, available from SARTOMER), 15 parts by weight of phenoxyethyl acrylate (SR339, available from SARTOMER), 1.5 parts by weight of 2,4,6-trimethylbenzoyldiphenylphosphine oxide as a photoinitiator, 1.5 parts by weight of methyl benzoylformate as a photoinitiator, and 2.0 parts by weight of bis(1,2,2,6,6-pentamethyl-4-piperidyl)sebacate as an additive was added with 5 parts by weight of polymethylmethacrylate particles (MH20F, available from KOLON) and 5 parts by weight of isobutane particles, and then mixed at 60° C. for 1 hour, thus preparing a composition (upon formation of a cured film, the glass transition temperature was 15° C., and the viscosity of the coating solution was 1300 cps at 25° C.). Thereafter, the composition thus obtained was applied on one surface of a super-transparent PET film (FHSS, available from KOLON) 188 μm thick as a substrate layer, the frame of a prism-shaped roller was covered therewith at 35° C., and then UV light was radiated onto the outer surface of the substrate layer at 900 mJ/cm$^2$ using a UV radiation system (600 W/inch$^2$, available from Fusion) provided with a Type-D bulb, thus forming linear triangular prisms having a vertex angle of 90°, a pitch of 50 μm, and a height of 25 μm and simultaneously foaming the isobutane particles using heat (150° C., 5 sec) generated from a UV curable lamp so that an average diameter thereof was 15 μm, thereby forming the light-collecting layer having a refractive index of 1.56.

Example 35

An optical sheet was manufactured in the same manner as in Example 33, with the exception that, in the formation of the light-collecting layer, the isobutane particles were used in an amount of 10 parts by weight based on 100 parts by weight of the curable composition.

Example 36

An optical sheet was manufactured in the same manner as in Example 34, with the exception that, in the formation of the light-collecting layer, the isobutane particles were used in an amount of 7 parts by weight based on 100 parts by weight of the curable composition.

Example 37

An optical sheet was manufactured in the same manner as in Example 34, with the exception that, in the formation of the light-collecting layer, the isobutane particles were used in an amount of 9 parts by weight based on 100 parts by weight of the curable composition.

Example 38

An optical sheet was manufactured in the same manner as in Example 34, with the exception that, in the formation of the light-collecting layer, the polymethylmethacrylate particles were used in an amount of 3 parts by weight based on 100 parts by weight of the curable composition.

Example 39

An optical sheet was manufactured in the same manner as in Example 34, with the exception that, in the formation of the light-collecting layer, the polymethylmethacrylate particles were used in an amount of 7 parts by weight based on 100 parts by weight of the curable composition.

Example 40

100 parts by weight of acrylic resin (52-666, available from AEKYUNG CHEMICAL) was diluted with 30 parts by weight of methylethylketone and 80 parts by weight of toluene, thus preparing a binder resin having a refractive index of 1.49. Thereafter, 50 parts by weight of spherical polymethylmethacrylate particles (MH20F, available from KOLON) having an average diameter of 20 μm and a refractive index of 1.49 and 50 parts by weight of isobutane particles were added to the binder resin and then monodispersed in a single layer using a milling machine, after which the dispersion thus obtained was applied on one surface of a super-transparent PET film (FHSS, available from KOLON) 188 μm thick as a substrate layer using a gravure coater and then cured at 120° C. for 60 sec, thus forming a light diffusion layer (refractive index: 1.49) having a dry thickness of 25 μm.

Further, on one surface of the cured light diffusion layer, a light-collecting layer was formed through the following procedures. Specifically, 40 parts by weight of the urethane acrylate oligomer of Synthesis Example 1, 30 parts by weight of bisphenol A acrylate, 10 parts by weight of phenoxyethyl methacrylate (SR340, available from SARTOMER), 15 parts by weight of phenoxyethyl acrylate (SR339, available from SARTOMER), 1.5 parts by weight of 2,4,6-trimethylbenzoyldiphenylphosphine oxide as a photoinitiator, 1.5 parts by weight of methyl benzoylformate as a photoinitiator, and 2.0 parts by weight of bis(1,2,2,6,6-pentamethyl-4-piperidyl)sebacate as an additive were mixed at 60° C. for 1 hour, thus preparing a composition (upon formation of the cured film, the glass transition temperature was 15° C., and the viscosity of the coating solution was 1300 cps at 25° C.). Thereafter, the composition thus obtained was applied on the light diffusion layer, the frame of a prism-shaped roller was covered therewith at 35° C., and then UV light was radiated onto the outer surface of the substrate layer at 900 mJ/cm$^2$ using a UV radiation system (600 W/inch$^2$, available from FUSION) provided with a Type-D bulb, thus forming linear triangular prisms (refractive index 1.56) having a vertex angle of 90°, a pitch of 50 μm, and a height of 25 μm.

Example 41

100 parts by weight of acrylic resin (52-666, available from AEKYUNG CHEMICAL) was diluted with 30 parts by weight of methylethylketone and 80 parts by weight of toluene, thus preparing a binder resin having a refractive index of 1.49. Thereafter, spherical polymethylmethacrylate particles (MH20F, available from KOLON) having an average diameter of 20 μm and a refractive index of 1.49 were added to the binder resin in an amount of 100 parts by weight based on the amount of the binder resin and then monodispersed in a single layer using a milling machine, after which the dispersion thus obtained was applied on one surface of a super-transparent PET film (FHSS, available from KOLON) 188 μm thick as a substrate layer using a gravure coater and then cured at 120° C. for 60 sec, thus forming a particle dispersion layer (refractive index: 1.49) having a dry thickness of 25 μm.

Further, on the other surface of the substrate layer, a light-collecting layer was formed through the following procedures. Specifically, 40 parts by weight of the urethane acrylate oligomer of Synthesis Example 1, 30 parts by weight of bisphenol A acrylate, 10 parts by weight of phenoxyethyl methacrylate (SR340, available from SARTOMER), 15 parts by weight of phenoxyethyl acrylate (SR339, available from SARTOMER), 1.5 parts by weight of 2,4,6-trimethylbenzoyldiphenylphosphine oxide as a photoinitiator, 1.5 parts by weight of methyl benzoylformate as a photoinitiator, and 2.0 parts by weight of bis(1,2,2,6,6-pentamethyl-4-piperidyl)sebacate as an additive were mixed at 60° C. for 1 hour, thus preparing a composition (upon formation of the cured film, the glass transition temperature was 15° C., and the viscosity of the coating solution was 1300 cps at 25° C.). Thereafter, the composition thus obtained was applied on the other surface of the substrate layer, the frame of a prism-shaped roller was covered therewith at 35° C., and then UV light was radiated onto the outer surface of the substrate layer at 900 mJ/cm$^2$ using a UV radiation system (600 W/inch$^2$, available from FUSION) provided with a Type-D bulb, thus forming linear triangular prisms (refractive index 1.56) having a vertex angle of 90°, a pitch of 50 μm, and a height of 25 μm.

Comparative Example 4

A prism film (LC213, available from KOLON) was layered on one surface of a light diffusion film (LD602, available from KOLON).

Comparative Example 5

A prism film (BEFIII, available from 3M) was layered on one surface of a light diffusion film (LD602, available from KOLON).

Comparative Example 6

A prism film (Brite-200, available from DOOSAN) was layered on one surface of a light diffusion film (LD602, available from KOLON).

Comparative Example 7

A prism film (LES-T2, available from LG) was layered on one surface of a light diffusion film (LD602, available from KOLON).

The damage resistance load, scratch resistance, luminance and adhesion stains of the optical sheet of each of Examples 17 to 41 and Comparative Examples 4 to 7 were measured through the above methods. The results are shown in Table 3 below.

Also, hiding performance was measured as follows. The results are given in Table 3 below.

(5) Hiding Performance

A backlight unit was turned-on and preheated for 2 hours, and then the luminance thereof was measured using BM-7 available from TOPCON. All of the sheets other than the reflection sheet and the diffusion plate were removed from the backlight unit (32"), and the optical sheet of each of the examples and comparative examples was mounted, after which luminance values were measured at an interval of 1 mm in every direction from the brightest point, and the difference between the maximum luminance and the minimum luminance was divided by the maximum luminance and then the resulting value was converted into a percentage, called a Weber fraction (%). This value indicates the lamp hiding performance of the optical sheet of each of the examples and comparative examples. As the Weber fraction was higher, hiding performance was evaluated to be low.

TABLE 3

| Ex. No. | Damage Resistance Load (g) | | | Scratch Resist. | Degree of Adhesion | Luminance (cd/m$^2$) | Hiding (%) |
| --- | --- | --- | --- | --- | --- | --- | --- |
| | 1$^{st}$ Test | 2$^{nd}$ Test | 3$^{rd}$ Test | | | | |
| 17 | 450 g | 350 g | 250 g | ⊙ | ○ | 2525 | 0.71 |
| 18 | 550 g | 500 g | 400 g | ⊙ | Δ | 2247 | 0.68 |
| 19 | 500 g | 450 g | 400 g | ⊙ | Δ | 2133 | 0.70 |
| 20 | 400 g | 350 g | 300 g | ⊙ | ○ | 2475 | 0.70 |
| 21 | 350 g | 300 g | 250 g | ⊙ | ○ | 2449 | 0.68 |
| 22 | 270 g | 250 g | 200 g | ⊙ | ○ | 2520 | 0.70 |
| 23 | 250 g | 230 g | 180 g | ⊙ | ○ | 2520 | 0.69 |
| 24 | 230 g | 200 g | 150 g | ⊙ | ⊙ | 2528 | 0.70 |
| 25 | 250 g | 200 g | 150 g | ⊙ | ⊙ | 2530 | 0.70 |
| 26 | 220 g | 180 g | 100 g | ○ | ⊙ | 2532 | 0.69 |
| 27 | 170 g | 150 g | 70 g | ○ | ⊙ | 2535 | 0.69 |
| 28 | 100 g | 70 g | 50 g | ○ | ⊙ | 2530 | 0.70 |
| 29 | 50 g | 30 g | 20 g | Δ | ⊙ | 2532 | 0.69 |
| 30 | 450 g | 350 g | 250 g | ⊙ | ○ | 2548 | 0.72 |

TABLE 3-continued

| Ex. No. | Damage Resistance Load (g) | | | Scratch Resist. | Degree of Adhesion | Luminance (cd/m$^2$) | Hiding (%) |
|---|---|---|---|---|---|---|---|
| | 1$^{st}$ Test | 2$^{nd}$ Test | 3$^{rd}$ Test | | | | |
| 31 | 450 g | 350 g | 250 g | ◉ | ○ | 2501 | 0.80 |
| 32 | 210 g | 170 g | 100 g | ○ | ◉ | 2527 | 0.70 |
| 33 | 210 g | 170 g | 100 g | ○ | ◉ | 2508 | 0.73 |
| 34 | 200 g | 150 g | 70 g | ◉ | ◉ | 2500 | 0.72 |
| 35 | 220 g | 170 g | 100 g | ◉ | ◉ | 2518 | 0.68 |
| 36 | 180 g | 150 g | 70 g | ◉ | ◉ | 2520 | 0.70 |
| 37 | 180 g | 150 g | 70 g | ◉ | ◉ | 2511 | 0.67 |
| 38 | 150 g | 120 g | 70 g | ◉ | ◉ | 2505 | 0.71 |
| 39 | 150 g | 120 g | 70 g | ◉ | ◉ | 2503 | 0.70 |
| 40 | 150 g | 100 g | 70 g | ◉ | ◉ | 2489 | 0.72 |
| 41 | 150 g | 100 g | 70 g | ◉ | ◉ | 2480 | 0.71 |
| C. 4 | 10 g | 70 g | 5 g | X | ◉ | 2580 | 0.80 |
| C. 5 | 10 g | 7 g | 3 g | X | ◉ | 2533 | 0.80 |
| C. 6 | 10 g | 5 g | 3 g | X | ◉ | 2528 | 0.80 |
| C. 7 | 10 g | 5 g | 3 g | X | ◉ | 2522 | 0.80 |

As is apparent from Table 3, the optical sheets according to the present invention having a damage resistance load of 20 g or more had superior scratch resistance of the structured surface. Also, the intrinsic luminance of the optical sheets was seen to be appropriate.

Thus, even when the optical sheet according to the present invention was subjected to external predetermined force, neither cracking nor distortion of the structured surface thereof occurred, resulting in no damage to the structured surface. Thereby, a decrease in luminance caused by damage to the light-collecting layer can be expected to be prevented.

In the case where the structured surface was formed using the coating solution having a glass transition temperature of about −15~25° C. upon curing, the damage resistance load was appropriate and none of adhesion stains were generated.

Even when the optical sheet according to the present invention was manufactured to be multifunctional, it could exhibit luminance and hiding performance approximately equivalent to those of conventional cases where a prism film and a light diffusion film were provided.

Hence, the efficient use of the light source could be increased while minimizing the loss of light, thereby increasing luminance and hiding performance. Thus, even if the light diffusion film and the prism film were not separately used as in conventional cases, luminance equivalent to or higher than that of conventional cases could be exhibited. The light-collecting layer capable of resisting damage caused by an external load or film layering was formed, thus obviating a need for a protective film. Thereby, problems occurring as a result of layering a plurality of films can be expected to be overcome.

Additionally, although the damage resistance load was slightly low in Examples 34 to 40, scratch resistance was superior (◉). This is considered to be because scratch resistance is evaluated to be superior upon observation with the naked eye, thanks to the foam beads contained in the air layer or the light diffusion layer or hiding effects by the layered structure.

The invention claimed is:

1. An optical sheet comprises; a substrate and a light-collecting layer having a structured surface formed with a plurality of optical three-dimensional patterns and including a curable resin,
wherein the optical sheet has a damage resistance load of 20 g or more, the damage resistance load being measured in a way such that a polyethyleneterephthalate film including a coating layer containing particles with a surface roughness of 0.5~15 μm and a hardness ranging from 2B to 2H is disposed on the structured surface of the optical sheet so that the coating layer of the polyethyleneterephthalate film is in contact with the structured surface of the optical sheet, the optical sheet is pulled at a rate of 300 mm/min while applying a varying load to the polyethyleneterephthalate film, and a maximum value of the varying load is defined as the damage resistance load when the structured surface of the optical sheet has no substantial damage, wherein the 'no substantial damage' means that no scratches occur upon observation with naked eyes and neither cracks nor height changes of the three-dimensional patterns occur upon observation using a scanning electron microscope in which a magnification falls in a range of from ×50 to ×500.

2. The optical sheet according to claim 1, wherein the optical sheet comprises:
the substrate layer;
a light diffusion layer formed on at least one surface of the substrate layer and including a binder resin and light-diffusing particles;
an air layer formed on the light diffusion layer and including a binder resin and foam beads; and
the light-collecting layer formed on the air layer and having the structured surface formed with the plurality of optical three-dimensional patterns and including the curable resin with or without foam beads.

3. The optical sheet according to claim 1, wherein the optical sheet comprises:
the substrate layer;
a light diffusion layer formed on at least one surface of the substrate layer and including a binder resin and light-diffusing particles; and
the light-collecting layer formed on the light diffusion layer and having the structured surface formed with the plurality of optical three-dimensional patterns and including the curable resin with foam beads.

4. The optical sheet according to claim 1, wherein the optical sheet comprises:
the substrate layer;
a light diffusion layer formed on at least one surface of the substrate layer and including a binder resin and light-diffusing particles; and
the light-collecting layer formed on the light diffusion layer and having the structured surface formed with the plurality of optical three-dimensional patterns and including the curable resin.

5. The optical sheet according to claim 1, wherein the optical sheet comprises:
- the substrate layer comprising a first surface and a second surface that is opposite to the first surface;
- a particle dispersion layer formed on the first surface of the substrate layer and including a binder resin and light-diffusing particles; and
- the light-collecting layer formed on the second surface of the substrate layer and having the structured surface formed with the plurality of optical three-dimensional patterns and including the curable resin.

6. The optical sheet according to claim 1, wherein the optical sheet comprises:
- the substrate layer; and
- the light-collecting layer formed on at least one surface of the substrate layer and having the structured surface formed with the plurality of optical three-dimensional patterns and including the curable resin with foam beads and light-diffusing particles.

7. The optical sheet according to claim 1, wherein the damage resistance load is 30 g or more.

8. The optical sheet according to claim 1, wherein the damage resistance load is 30~500 g.

9. The optical sheet according to claim 1, wherein the curable resin is formed from a curable composition comprising one or more ultraviolet (UV) light curable oligomers or UV light curable monomers selected from among at least one compound selected from among a urethane acrylate-based compound, a styrene-based compound, a butadiene-based compound, an isoprene monomer and a silicone acrylate-based compound, and mixtures thereof with at least one compound selected from among a bisphenol acrylate-based compound and a fluorene acrylate-based compound; and a photoinitiator.

10. The optical sheet according to claim 9, wherein the curable resin is formed from the curable composition having a viscosity of 100-5,000 cps at 25° C.

11. The optical sheet according to claim 1, wherein the curable resin is formed from a curable composition comprising a urethane acrylate-based compound and a bisphenol acrylate-based compound as the UV light curable oligomers or UV light curable monomers.

12. The optical sheet according to claim 11, wherein the curable resin is formed from the curable composition in which the urethane acrylate-based compound is contained in an amount of 10~80 parts by weight based on 100 parts by weight of a total solid content.

13. The optical sheet according to claim 12, wherein the curable resin is formed from the curable composition in which the bisphenol acrylate-based compound is contained in an amount of 5-80 parts by weight based on 100 parts by weight of a total solid content.

14. The optical sheet according to claim 11, wherein the curable resin is formed from the curable composition in which the bisphenol acrylate-based compound is contained in an amount of 5~80 parts by weight based on 100 parts by weight of a total solid content.

15. The optical sheet according to claim 1, wherein the curable resin has a glass transition temperature of 40° C. or lower.

16. The optical sheet according to claim 15, wherein the curable resin has a glass transition temperature of −15-25° C.

17. The optical sheet according to claim 1, wherein the optical three-dimensional patterns have one or more shapes selected from among polyhedrons having a polygonal, semicircular or semi-elliptical cross-section, columns having a polygonal, semicircular or semi-elliptical cross-section, and curved columns having a polygonal, semicircular or semi-elliptical cross-section.

18. The optical sheet according to claim 1, wherein the optical three-dimensional patterns are provided in a shape of columns having a triangular cross-section with a vertex angle of 90°.

* * * * *